United States Patent
Pagaila et al.

(10) Patent No.: US 8,119,447 B2
(45) Date of Patent: Feb. 21, 2012

(54) INTEGRATED CIRCUIT PACKAGING SYSTEM WITH THROUGH VIA DIE HAVING PEDESTAL AND RECESS AND METHOD OF MANUFACTURE THEREOF

(75) Inventors: Reza Argenty Pagaila, Singapore (SG); Byung Tai Do, Singapore (SG); Linda Pei Ee Chua, Singapore (SG)

(73) Assignee: Stats Chippac Ltd., Singapore (SG)

( * ) Notice: Subject to any disclaimer, the term of this patent is extended or adjusted under 35 U.S.C. 154(b) by 33 days.

(21) Appl. No.: 12/486,271

(22) Filed: Jun. 17, 2009

(65) Prior Publication Data

US 2010/0320601 A1  Dec. 23, 2010

(51) Int. Cl.
- H01L 21/44 (2006.01)
- H01L 21/48 (2006.01)
- H01L 21/50 (2006.01)
- H01L 23/34 (2006.01)
- H01L 23/48 (2006.01)

(52) U.S. Cl. ...... 438/106; 438/107; 438/112; 438/124; 438/126; 438/127; 257/723; 257/724; 257/784; 257/787

(58) Field of Classification Search ............ 257/686, 257/777, 778, 738, 787, 776, 780, 790, 723, 257/724, 784, 773; 438/106, 107, 109, 110, 438/112, 124, 126, 127
See application file for complete search history.

(56) References Cited

U.S. PATENT DOCUMENTS

| | | | | |
|---|---|---|---|---|
| 5,081,563 | A  * | 1/1992  | Feng et al. | 361/795 |
| 6,229,215 | B1 * | 5/2001  | Egawa | 257/777 |
| 6,297,548 | B1 * | 10/2001 | Moden et al. | 257/686 |
| 6,586,826 | B1 * | 7/2003  | Glenn et al. | 257/686 |
| 7,242,101 | B2   | 7/2007  | Ararao et al. | |
| 7,332,819 | B2   | 2/2008  | Tan et al. | |
| 7,332,820 | B2   | 2/2008  | Tan et al. | |
| 7,344,969 | B2   | 3/2008  | Tan et al. | |
| 7,358,117 | B2   | 4/2008  | Tan et al. | |
| 7,371,608 | B2   | 5/2008  | Tan et al. | |
| 7,514,204 | B2   | 4/2009  | Hatakeyama et al. | |
| 7,572,681 | B1 * | 8/2009  | Huemoeller et al. | 438/125 |
| 2008/0032449 | A1 | 2/2008 | Tan et al. | |
| 2008/0096316 | A1 | 4/2008 | Tan et al. | |
| 2008/0136045 | A1 | 6/2008 | Tan et al. | |

OTHER PUBLICATIONS

U.S. Appl. No. 12/398,782, filed Mar. 5, 2009, Pagaila et al.

* cited by examiner

*Primary Examiner* — Chuong A. Luu
(74) *Attorney, Agent, or Firm* — Mikio Ishimaru

(57) ABSTRACT

A method of manufacture of an integrated circuit packaging system includes: providing a structure having a via filled with conductive material completely through the structure, a recess, and a pedestal portion bordering the recess; mounting a semiconductor device inside the recess in the structure; and encapsulating the structure and the semiconductor device in an encapsulation.

20 Claims, 7 Drawing Sheets

INTEGRATED CIRCUIT PACKAGING SYSTEM WITH THROUGH VIA DIE HAVING PEDESTAL AND RECESS AND METHOD OF MANUFACTURE THEREOF

TECHNICAL FIELD

The present invention relates generally to an integrated circuit packaging system, and more particularly to a system for utilizing a through via die having pedestal and recess in an integrated circuit packaging system.

BACKGROUND

The rapidly growing market for portable electronics devices, e.g. cellular phones, laptop computers, and PDAs, is an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high-speed computer devices that are projected to exceed one TeraHertz (THz) in the near future. The current technologies, materials, equipment, and structures offer challenges to the basic assembly of these new devices while still not adequately addressing cooling and reliability concerns.

The envelope of technical capability of next level interconnect assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors, which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a structure having a via filled with conductive material completely through the structure, a recess, and a pedestal portion bordering the recess; mounting a semiconductor device inside the recess in the structure; and encapsulating the structure and the semiconductor device in an encapsulation.

The present invention provides an integrated circuit packaging system including: a structure having a via filled with conductive material completely through the structure, a recess, and a pedestal portion bordering the recess; a semiconductor device mounted inside the recess in the structure; and an encapsulation encapsulating the structure and the semiconductor device.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
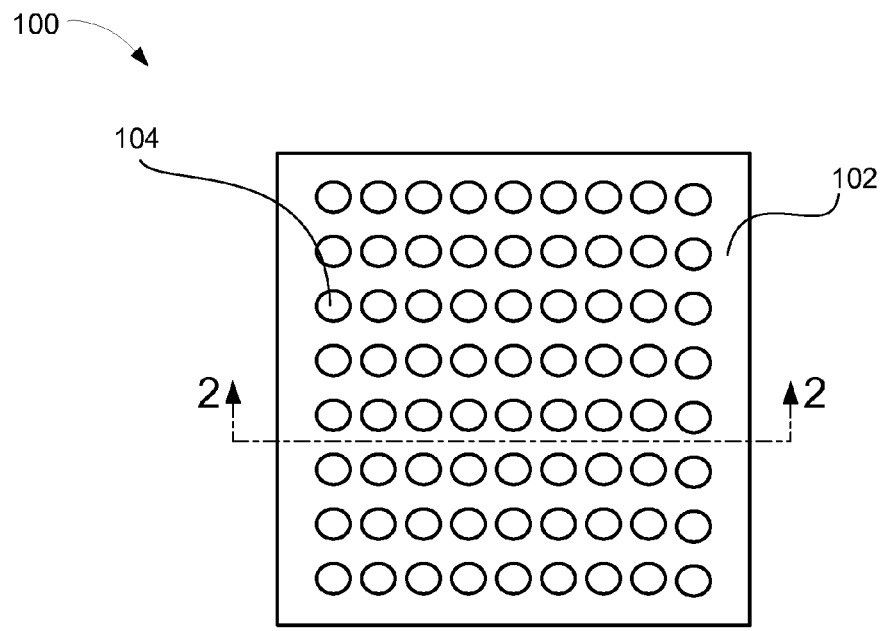
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The integrated circuit packaging system 100 is shown having an encapsulation 102 partially encapsulating embedded-solder-balls 104.

Figure 2:
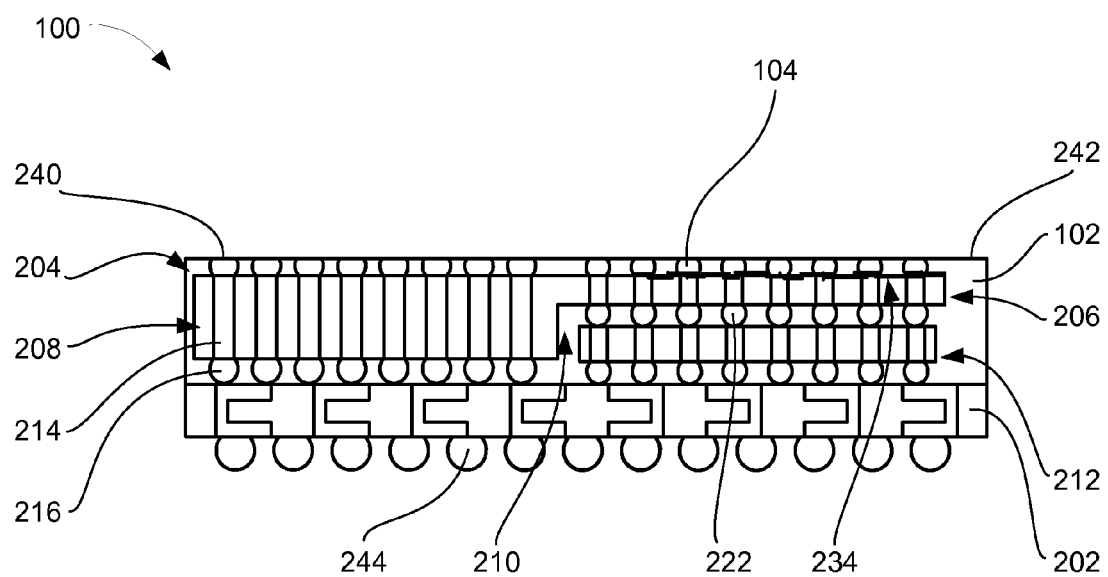
FIG. 2 is a cross-sectional view of the integrated circuit packaging system along the line 2-2 of FIG. 1.

Referring now to FIG. 2, therein is shown a cross-sectional view of the integrated circuit packaging system 100 along the line 2-2 of FIG. 1. The integrated circuit packaging system 100 is shown having a substrate 202 such as a ceramic or laminated plastic substrate.

Mounted above the substrate 202 is a structure such as a Through Silicon Via die (TSV die 204). The TSV die 204 is shown having a body portion 206 and a pedestal portion 208. The pedestal portion 208 is integral to the body portion 206 and combine to form a recess 210.

The body portion 206 is elevated above a semiconductor device 212 such as a through silicon via die, which is positioned within the recess 210. The pedestal portion 208 is sufficiently tall to provide a sufficiently large recess in the body portion 206 to accommodate the semiconductor device 212. The recess 210 helps to reduce the overall size of the package allowing for application in increasingly thin electronic devices.

The pedestal portion 208 of the TSV die 204 is shown having vias filled with conductive material such as Through Silicon Vias 214. It has been discovered that the Through Silicon Vias 214 in the pedestal portion 208 provide an extremely efficient electronic signal path, while the height of the pedestal portion 208 allows the pedestal portion 208 to be connected to the substrate 202 using a very fine pitch. Therefore, internal interconnects 216 such as solder balls connecting the pedestal portion 208 to the substrate 202 may be very high density providing greater I/O capacity.

Further, because the internal interconnects 216 may be much smaller, the collapse characteristics are unexpectedly improved. Still further, the pedestal portion 208 reduces the amount of filler needed to manufacture the integrated circuit package therefore reducing production costs.

The semiconductor device 212 may be connected to the substrate 202 with the internal interconnects 216. The semiconductor device 212 is mounted inside the recess 210 of the TSV die 204 between the TSV die 204 and the substrate 202. The semiconductor device 212 is depicted as a through via die. Solder balls 222 connect the semiconductor device 212 to the Through Silicon Vias 214.

It has been discovered that utilizing the Through Silicon Vias 214 in the body portion 206 of the TSV die 204 increases electrical performance by reducing connection distance between the semiconductor device and external connections. This improves electrical performance by reducing resistance and parasitic inductance. This allows higher frequency data transmission at lower power.

Above the body portion 206 of the TSV die 204 a redistribution layer (RDL 234) may be deposited on the top surface of the TSV die 204. A redistribution layer is defined as: "a conductive layer or layers that that route electric signals, possibly including power and ground, from one point to another." The redistribution layer may be insulated by dielectric layers and may be formed by thinfilm deposition or electroplating, and then etching or planarizing. Formation of the redistribution layer may include a damascene or dual-damascene process steps. The RDL 234 may be used to electrically connect various I/O points on the TSV die 204 with the Through Silicon Vias 214 or other I/O points.

Deposited above the TSV die 204 and to the RDL 234 or the Through Silicon Vias 214 or both are the embedded-solder-balls 104. The embedded-solder-balls 104 are embedded in the encapsulation 102 but a surface 240 of the embedded-solder-balls 104 remains exposed from a top surface 242 of the encapsulation 102.

The encapsulation 102 also encapsulates the TSV die 204, the semiconductor device 212 and the internal interconnects 216 above the substrate 202. Below the substrate 202 are external interconnects 244 such as solder ball external interconnects.

Figure 3A:
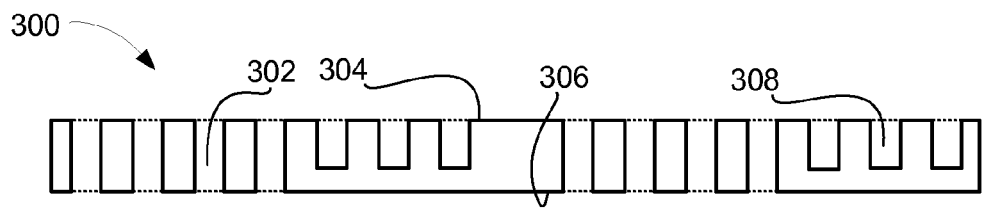
FIG. 3A is a cross-sectional view of a through via die after a hole forming phase of manufacture.

Referring now to FIG. 3A, therein is shown a cross-sectional view of a through via die 300 after a hole forming phase of manufacture. The through via die 300 is shown having through holes 302 formed from a top side 304 to a bottom side 306 of a wafer 307 such as a silicon wafer.

The through via die 300 is further shown having blind holes 308 formed from the top side 304. The blind holes 308 do not traverse the entire width of the through via die 300 and help to reduce production costs.

Figure 3B:
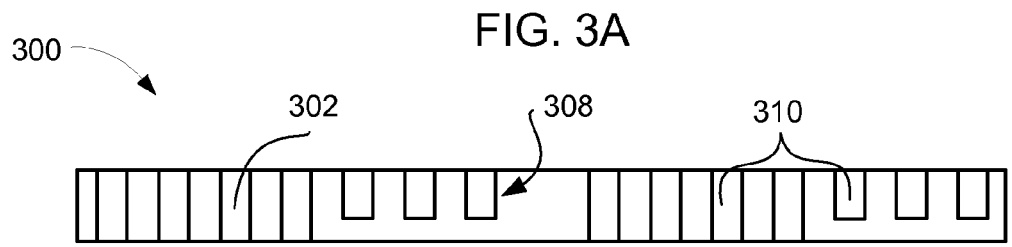
FIG. 3B is the through via die of FIG. 3A after a filling phase of manufacture.

Referring now to FIG. 3B, therein is shown the through via die 300 of FIG. 3A after a filling phase of manufacture. The through via die 300 is shown having the through holes 302 and the blind holes 308 filled with a conductive filler 310. The conductive filler 310 may be a combination of metal layers including a barrier layer or seed layers. Further, insulation layers may be deposited on to the inner surface of the through holes 302 and the inner surface of the blind holes 308.

Figure 3C:
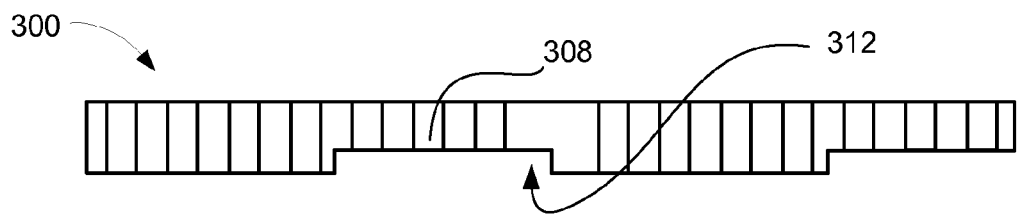
FIG. 3C is the through via die of FIG. 3A after a recess forming phase of manufacture.

Referring now to FIG. 3C, therein is shown the through via die 300 of FIG. 3A after a recess forming phase of manufacture. The wafer 307 is shown having a recess 312 formed so as to expose the blind holes 308 from the through via die 300. The recesses may be formed by etching or by grinding.

Figure 3D:
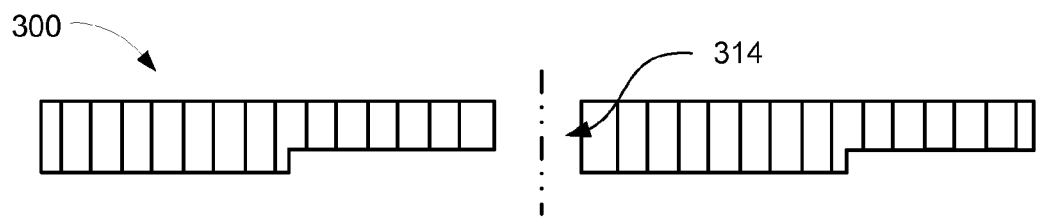
FIG. 3D is the through via die of FIG. 3A in a singulation phase of manufacture.

Referring now to FIG. 3D, therein is shown the through via die 300 of FIG. 3A in a singulation phase of manufacture. The wafer 307 is shown being singulated along a singulation path 314 singulating the wafer 307 into the through via die 300.

Figure 4A:
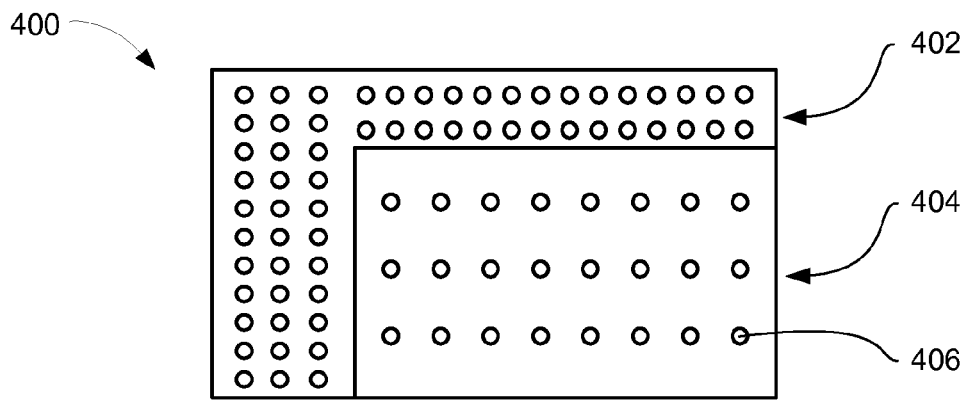
FIG. 4A is a bottom view of a through via die in an L-shape layout.

Referring now to FIG. 4A, therein is shown a bottom view of a through via die 400 in an L-shape layout. The through via die 400 is shown having a pedestal portion 402 in an L-shape that borders two sides of a recess portion 404. The recess portion 404 is largely rectangular. Also shown are internal interconnects 406 such as solder balls.

Figures 4B, 4C:
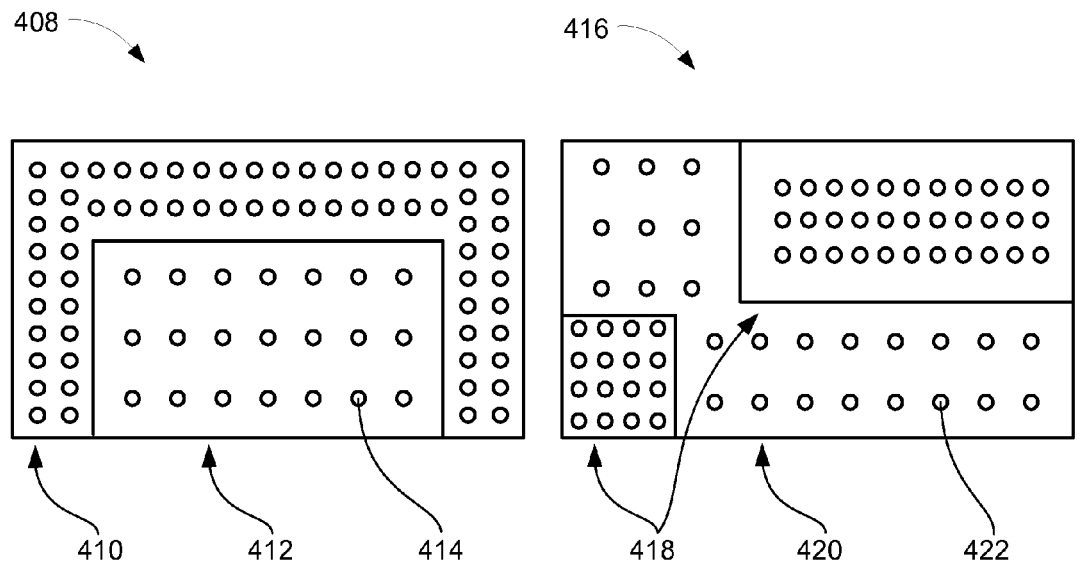
FIG. 4B is a bottom view of a through via die in a U-shape layout.
FIG. 4C is a bottom view of a through via die in a pedestal plurality layout.

Referring now to FIG. 4B, therein is shown a bottom view of a through via die 408 in a U-shape layout. The through via die 408 is shown having a pedestal portion 410 in a U-shape that borders three sides of a recess portion 412. The recess portion 412 is largely rectangular. Also shown are internal interconnects 414 such as solder balls.

Referring now to FIG. 4C, therein is shown a bottom view of a through via die 416 in a pedestal plurality layout. The through via die 416 is shown having a pedestal portion 418 in a plurality layout having many individual pedestal portions that border many sides of a recess portion 420. Also shown are internal interconnects 422 such as solder balls.

Figure 5:
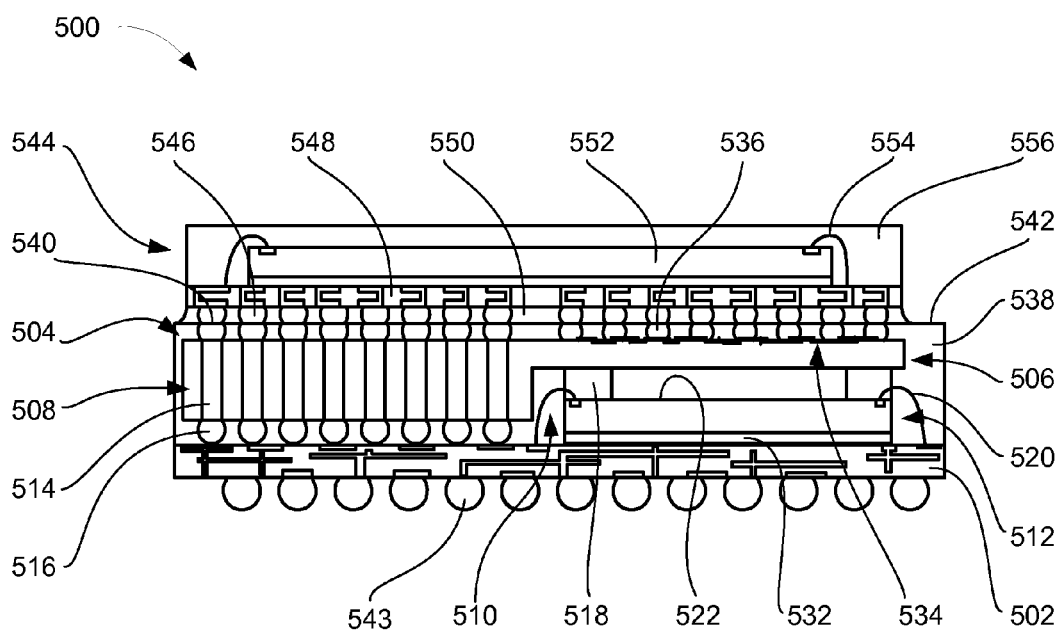
FIG. 5 is a cross-sectional view of an integrated circuit packaging system in a second embodiment of the present invention.

Referring now to FIG. 5, therein is shown a cross-sectional view of an integrated circuit packaging system 500 in a second embodiment of the present invention. The integrated circuit packaging system 500 is shown having a substrate 502 such as a ceramic or laminated plastic substrate.

Mounted above the substrate 502 is a structure such as a Through Silicon Via die (TSV die 504). The TSV die 504 is shown having a body portion 506 and a pedestal portion 508. The pedestal portion 508 is integral to the body portion 506 and combine to form a recess 510.

The body portion 506 is elevated above a semiconductor device 512, which is positioned within the recess 510. The pedestal portion 508 is sufficiently tall to provide a sufficiently large recess in the body portion 506 to accommodate the semiconductor device 512. The recess 510 helps to reduce the overall size of the package allowing for application in increasingly thin electronic devices.

The pedestal portion 508 of the TSV die 504 is shown having Through Silicon Vias 514. It has been discovered that the Through Silicon Vias 514 in the pedestal portion 508 provide an extremely efficient electronic signal path, while the height of the pedestal portion 508 allows the pedestal portion 508 to be connected to the substrate 502 using a very fine pitch. Therefore, internal interconnects 516 such as solder balls connecting the pedestal portion 508 to the substrate 502 may be very high density providing greater I/O capacity.

Further, because the internal interconnects 516 may be much smaller, the collapse characteristics are unexpectedly improved. Still further, the pedestal portion 508 reduces the amount of filler needed to manufacture the integrated circuit package therefore reducing production costs.

The semiconductor device 512 may be attached to the body portion 506 of the TSV die 504 with a wire-in-film adhesive 518. The wire-in-film adhesive 518 has a low viscosity and, as temperature increases, the viscosity gets lower. Therefore, the wire-in-film adhesive 518 can be easily pressed over internal interconnects such as bond wires 520 connecting the semiconductor device 512 to the substrate 502, and then cured to harden the wire-in-film adhesive 518.

The semiconductor device 512 is depicted as a wire-bonded die with an active side 522. The active side of the semiconductor device faces the body portion 506 of the TSV die 504. The semiconductor device 512 is mounted to the substrate 502 with a die attach adhesive 532.

Above the body portion 506 of the TSV die 504 a redistribution layer (RDL 534) may be deposited on the top surface of the TSV die 504. The RDL 534 may be used to electrically connect various I/O points on the TSV die 504 with the Through Silicon Vias 514 or other I/O points.

Deposited above the TSV die 504 and to the RDL 534 or the Through Silicon Vias 514 or both are embedded-solder-balls 536. The embedded-solder-balls 536 are embedded in an encapsulation 538 but a surface 540 of the embedded-solder-balls 536 remains exposed from a top surface 542 of the encapsulation 538.

The encapsulation 538 also encapsulates the TSV die 504, the semiconductor device 512 and the internal interconnects 516 above the substrate 502. Below the substrate 502 are external interconnects 543 such as solder ball external interconnects.

Optionally, an external device 544 may be mounted above the encapsulation 538. The external device 544 may be connected to the embedded-solder-balls 536 with interconnects 546 such as solder balls.

The external device 544 has an external substrate 548. Filling between the external substrate 548 and the encapsulation 538 is an underfill 550. The underfill 550 enhances structural rigidity and increases the life of the connection between the external device 544 and the embedded-solder-balls 536.

Mounted above the external substrate 548 is an external device semiconductor 552 such as a wire-bonded die connected to the substrate with external device bond wires 554. The external device semiconductor 552 is encapsulated in an external device encapsulation 556.

Figure 6:
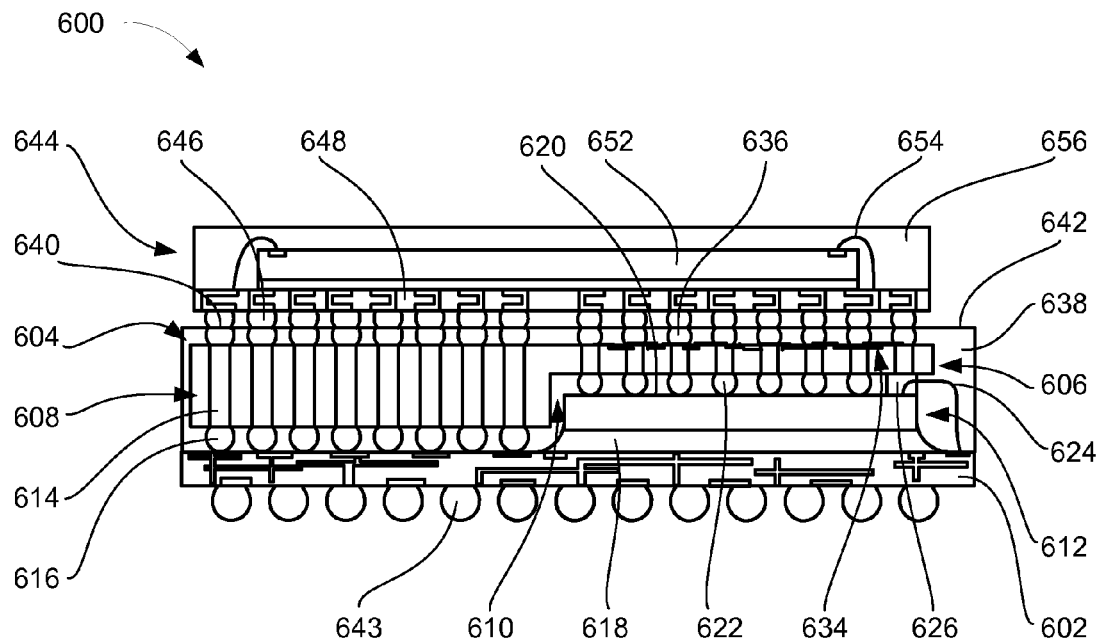
FIG. 6 is a cross-sectional view of an integrated circuit packaging system in a third embodiment of the present invention.

Referring now to FIG. 6, therein is shown a cross-sectional view of an integrated circuit packaging system 600 in a third embodiment of the present invention. The integrated circuit packaging system 600 is shown having a substrate 602 such as a ceramic or laminated plastic substrate.

Mounted above the substrate 602 is a structure such as a Through Silicon Via die (TSV die 604). The TSV die 604 is shown having a body portion 606 and a pedestal portion 608.

The pedestal portion 608 is integral to the body portion 606 and combine to form a recess 610.

The body portion 606 is elevated above a semiconductor device 612, which is positioned within the recess 610. The pedestal portion 608 is sufficiently tall to provide a sufficiently large recess in the body portion 606 to accommodate the semiconductor device 612. The recess 610 helps to reduce the overall size of the package allowing for application in increasingly thin electronic devices.

The pedestal portion 608 of the TSV die 604 is shown having Through Silicon Vias 614. It has been discovered that the Through Silicon Vias 614 in the pedestal portion 608 provide an extremely efficient electronic signal path, while the height of the pedestal portion 608 allows the pedestal portion 608 to be connected to the substrate 602 using a very fine pitch. Therefore, internal interconnects 616 such as solder balls connecting the pedestal portion 608 to the substrate 602 may be very high density providing greater I/O capacity.

Further, because the internal interconnects 616 may be much smaller, the collapse characteristics are unexpectedly improved. Still further, the pedestal portion 608 reduces the amount of filler needed to manufacture the integrated circuit package therefore reducing production costs.

The semiconductor device 612 may be attached to the substrate 602 with a die attach adhesive 618. The semiconductor device 612 is depicted as a bumped die with an active side 620 facing the body portion 606 of the TSV die 604. Solder balls 622 connect the active side 620 of the semiconductor device 612 to the Through Silicon Vias 614. The active side 620 of the semiconductor device 612 is connected to the substrate 602 with bond wires 624. Surrounding the bond wires 624 is a wire-in-film adhesive 626.

It has been discovered that utilizing the Through Silicon Vias 614 in the body portion 606 of the TSV die 604 increases electrical performance by reducing connection distance between the semiconductor device and external connections. This improves electrical performance by reducing resistance and parasitic inductance. This allows higher frequency data transmission at lower power.

Above the body portion 606 of the TSV die 604 a redistribution layer (RDL 634) may be deposited on the top surface of the TSV die 604. The RDL 634 may be used to electrically connect various I/O points on the TSV die 604 with the Through Silicon Vias 614 or other I/O points.

Deposited above the TSV die 604 and to the RDL 634 or the Through Silicon Vias 614 or both are embedded-solder-balls 636. The embedded-solder-balls 636 are embedded in an encapsulation 638 but a surface 640 of the embedded-solder-balls 636 remains exposed from a top surface 642 of the encapsulation 638.

The encapsulation 638 also encapsulates the TSV die 604, the semiconductor device 612 and the internal interconnects 616 above the substrate 602. Below the substrate 602 are external interconnects 643 such as solder ball external interconnects.

Optionally, an external device 644 may be mounted above the encapsulation 638. The external device 644 may be connected to the embedded-solder-balls 636 with interconnects 646 such as solder balls.

The external device 644 has an external substrate 648. Mounted above the external substrate 648 is an external device semiconductor 652 such as a wire-bonded die connected to the substrate with external device bond wires 654. The external device semiconductor 652 is encapsulated in an external device encapsulation 656.

Figure 7:
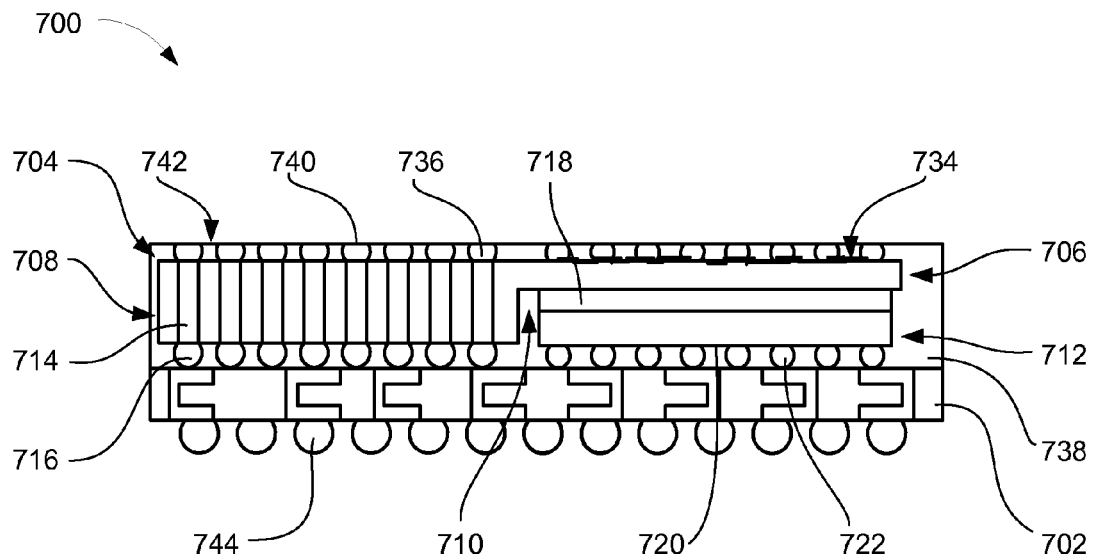
FIG. 7 is a cross-sectional view of an integrated circuit packaging system in a fourth embodiment of the present invention.

Referring now to FIG. 7, therein is shown a cross-sectional view of an integrated circuit packaging system 700 in a fourth embodiment of the present invention. The integrated circuit packaging system 700 is shown having a substrate 702 such as a ceramic or laminated plastic substrate.

Mounted above the substrate 702 is a structure such as a Through Silicon Via die (TSV die 704). The TSV die 704 is shown having a body portion 706 and a pedestal portion 708. The pedestal portion 708 is integral to the body portion 706 and combine to form a recess 710.

The body portion 706 is elevated above a semiconductor device 712, which is positioned within the recess 710. The pedestal portion 708 is sufficiently tall to provide a sufficiently large recess in the body portion 706 to accommodate the semiconductor device 712. The recess 710 helps to reduce the overall size of the package allowing for application in increasingly thin electronic devices.

The pedestal portion 708 of the TSV die 704 is shown having Through Silicon Vias 714. It has been discovered that the Through Silicon Vias 714 in the pedestal portion 708 provide an extremely efficient electronic signal path, while the height of the pedestal portion 708 allows the pedestal portion 708 to be connected to the substrate 702 using a very fine pitch. Therefore, internal interconnects 716 such as solder balls connecting the pedestal portion 708 to the substrate 702 may be very high density providing greater I/O capacity.

Further, because the internal interconnects 716 may be much smaller, the collapse characteristics are unexpectedly improved. Still further, the pedestal portion 708 reduces the amount of filler needed to manufacture the integrated circuit package therefore reducing production costs.

The semiconductor device 712 may be attached to the body portion 706 of the TSV die 704 with a die attach adhesive 718. The semiconductor device 712 is depicted as a flip-chip with an active side 720 facing the substrate 702. Solder balls 722 connect the active side 720 of the semiconductor device 712 to the substrate 702.

Above the body portion 706 of the TSV die 704 a redistribution layer (RDL 734) may be deposited on the top surface of the TSV die 704. The RDL 734 may be used to electrically connect various I/O points on the TSV die 704 with the Through Silicon Vias 714 or other I/O points.

Deposited above the TSV die 704 and to the RDL 734 or the Through Silicon Vias 714 or both are embedded-solder-balls 736. The embedded-solder-balls 736 are embedded in an encapsulation 738 but a surface 740 of the embedded-solder-balls 736 remains exposed from a top surface 742 of the encapsulation 738.

The encapsulation 738 also encapsulates the TSV die 704, the semiconductor device 712 and the internal interconnects 716 above the substrate 702. Below the substrate 702 are external interconnects 744 such as solder ball external interconnects.

Figure 8:
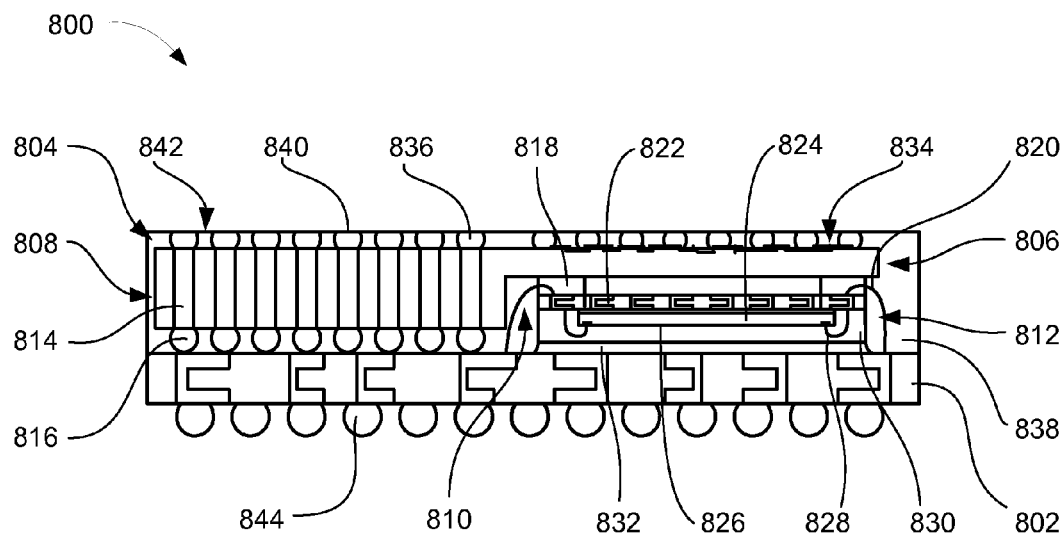
FIG. 8 is a cross-sectional view of an integrated circuit packaging system in a fifth embodiment of the present invention.

Referring now to FIG. 8, therein is shown a cross-sectional view of an integrated circuit packaging system 800 in a fifth embodiment of the present invention. The integrated circuit packaging system 800 is shown having a substrate 802 such as a ceramic or laminated plastic substrate.

Mounted above the substrate 802 is a structure such as a Through Silicon Via die (TSV die 804). The TSV die 804 is shown having a body portion 806 and a pedestal portion 808. The pedestal portion 808 is integral to the body portion 806 and combine to form a recess 810.

The body portion 806 is elevated above a semiconductor device 812, which is positioned within the recess 810. The pedestal portion 808 is sufficiently tall to provide a sufficiently large recess in the body portion 806 to accommodate the semiconductor device 812. The recess 810 helps to reduce the overall size of the package allowing for application in increasingly thin electronic devices.

The pedestal portion 808 of the TSV die 804 is shown having Through Silicon Vias 814. It has been discovered that the Through Silicon Vias 814 in the pedestal portion 808 provide an extremely efficient electronic signal path, while the height of the pedestal portion 808 allows the pedestal portion 808 to be connected to the substrate 802 using a very fine pitch. Therefore, internal interconnects 816 such as solder balls connecting the pedestal portion 808 to the substrate 802 may be very high density providing greater I/O capacity.

Further, because the internal interconnects 816 may be much smaller, the collapse characteristics are unexpectedly improved. Still further, the pedestal portion 808 reduces the amount of filler needed to manufacture the integrated circuit package therefore reducing production costs.

The semiconductor device 812 may be attached to the body portion 806 of the TSV die 804 with a wire-in-film adhesive 818. The wire-in-film adhesive 818 has a low viscosity and, as temperature increases, the viscosity gets lower. Therefore, the wire-in-film adhesive 818 can be easily pressed over bond wires 820 connecting the semiconductor device 812 to the substrate 802, and then cured to harden the wire-in-film adhesive 818.

The semiconductor device 812 is depicted as an inverted semiconductor package having a substrate 822 typically a UV stabilized woven glass and epoxy resin with etched copper conductive pathways. Mounted below the substrate 822 is a wire-bonded die 824 with an active side 826 facing away from the substrate 822 and connected to the substrate 822 with bond wires 828.

The wire-bonded die 824 and the bond wires 828 of the semiconductor device 812 are encapsulated with a device encapsulation 830. The device encapsulation 830 of the semiconductor device 812 is mounted to the substrate 802 with a die attach adhesive 832.

Above the body portion 806 of the TSV die 804 a redistribution layer (RDL 834) may be deposited on the top surface of the TSV die 804. The RDL 834 may be used to electrically connect various I/O points on the TSV die 804 with the Through Silicon Vias 814 or other I/O points.

Deposited above the TSV die 804 and to the RDL 834 or the Through Silicon Vias 814 or both are embedded-solder-balls 836. The embedded-solder-balls 836 are embedded in an encapsulation 838 but a surface 840 of the embedded-solder-balls 836 remains exposed from a top surface 842 of the encapsulation 838.

The encapsulation 838 also encapsulates the TSV die 804, the semiconductor device 812 and the internal interconnects 816 above the substrate 802. Below the substrate 802 are external interconnects 844 such as solder ball external interconnects.

Figure 9:
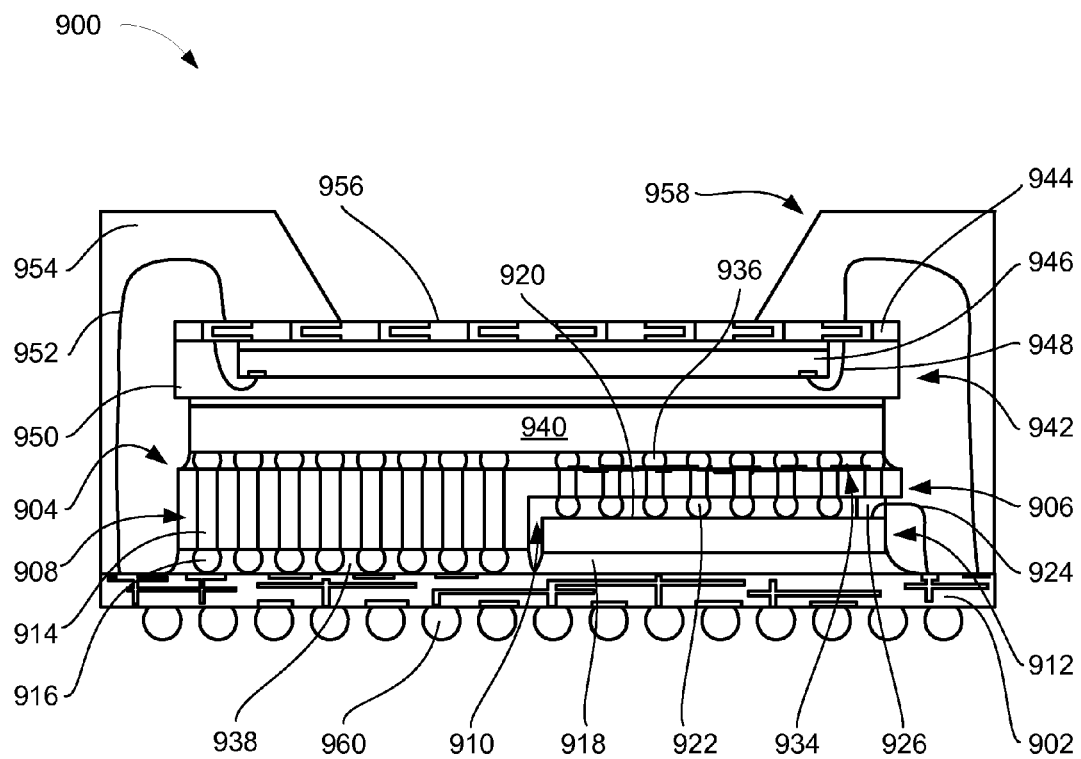
FIG. 9 is a cross-sectional view of an integrated circuit packaging system in a sixth embodiment of the present invention.

Referring now to FIG. 9, therein is shown a cross-sectional view of an integrated circuit packaging system 900 in a sixth embodiment of the present invention. The integrated circuit packaging system 900 is shown having a substrate 902 such as a ceramic or laminated plastic substrate.

Mounted above the substrate 902 is a structure such as a Through Silicon Via die (TSV die 904). The TSV die 904 is shown having a body portion 906 and a pedestal portion 908. The pedestal portion 908 is integral to the body portion 906 and combine to form a recess 910.

The body portion 906 is elevated above a semiconductor device 912, which is positioned within the recess 910. The pedestal portion 908 is sufficiently tall to provide a sufficiently large recess in the body portion 906 to accommodate the semiconductor device 912. The recess 910 helps to reduce the overall size of the package allowing for application in increasingly thin electronic devices.

The pedestal portion 908 of the TSV die 904 is shown having Through Silicon Vias 914. It has been discovered that the Through Silicon Vias 914 in the pedestal portion 908 provide an extremely efficient electronic signal path, while the height of the pedestal portion 908 allows the pedestal portion 908 to be connected to the substrate 902 using a very fine pitch. Therefore, internal interconnects 916 such as solder balls connecting the pedestal portion 908 to the substrate 902 may be very high density providing greater I/O capacity.

Further, because the internal interconnects 916 may be much smaller, the collapse characteristics are unexpectedly improved. Still further, the pedestal portion 908 reduces the amount of filler needed to manufacture the integrated circuit package therefore reducing production costs.

The semiconductor device 912 may be attached to the substrate 902 with a die attach adhesive 918. The semiconductor device 912 is depicted as a bumped die with an active side 920 facing the body portion 906 of the TSV die 904. Solder balls 922 connect the active side 920 of the semiconductor device 912 to the Through Silicon Vias 914.

It has been discovered that utilizing the Through Silicon Vias 914 in the body portion 906 of the TSV die 904 increases electrical performance by reducing connection distance between the semiconductor device and external connections. This improves electrical performance by reducing resistance and parasitic inductance. This allows higher frequency data transmission at lower power.

Above the body portion 906 of the TSV die 904 a redistribution layer (RDL 934) may be deposited on the top surface of the TSV die 904. The RDL 934 may be used to electrically connect various I/O points on the TSV die 904 with the Through Silicon Vias 914 or other I/O points.

Deposited above the TSV die 904 and to the RDL 934 or the Through Silicon Vias 914 or both are embedded-solder-balls 936. The embedded-solder-balls 936 are embedded in an underfill 938, which helps to provide structural rigidity and extended life to connections with the embedded-solder-balls 938. The underfill 938 may also be used between the pedestal portion 908 and the substrate 902 to secure the internal interconnects 916 to the substrate 902.

Mounted above the TSV die 904 is a flip-chip 940. The flip-chip 940 is connected to the embedded-solder-balls 936. Mounted above the flip-chip 940 is an inner stacking module 942. The inner stacking module 942 is attached to the flip-chip 940 with the die attach adhesive 918.

The inner stacking module 942 has an ISM substrate 944. Mounted below the ISM substrate 944 is an ISM device semiconductor 946 such as a wire-bonded die connected to the substrate with ISM device bond wires 948. The ISM device semiconductor 946 is encapsulated in an ISM encapsulation 950.

The ISM substrate 944 faces away from the substrate 902 and the ISM substrate 944 is connected to the substrate 902 from above by ISM bond wires 952. The inner stacking module 942, the TSV die 904 and the flip-chip 940 are encapsulated by an encapsulation 954.

The ISM substrate 944 has a surface 956 exposed from the encapsulation 954. The surface 956 of the ISM substrate 944 is ideal for integrating external components into the integrated circuit packaging system 900.

Further, The ISM bond wires 952 connected to the ISM substrate 944 are encapsulated by the encapsulation 954 forming mold risers 958 extending up from the ISM substrate 944. The mold risers 958 may act as structural support for later mounted components. Below the substrate 902 are external interconnects 960 such as solder ball external interconnects.

Figure 10:
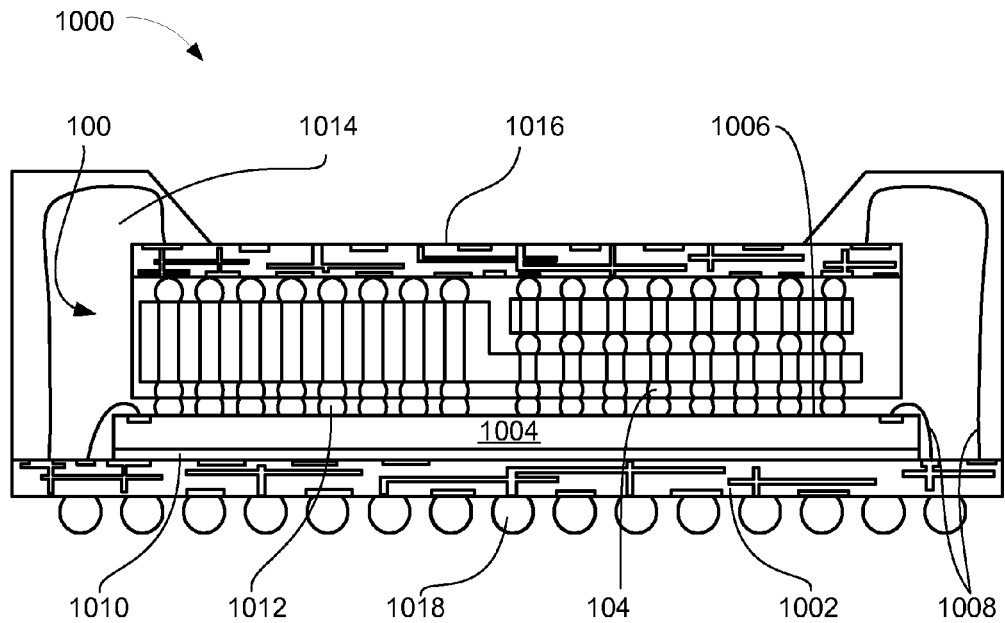
FIG. 10 is a cross-sectional view of an integrated circuit packaging system in a seventh embodiment of the present invention.

Referring now to FIG. 10, therein is shown a cross-sectional view of an integrated circuit packaging system 1000 in a seventh embodiment of the present invention. The integrated circuit packaging system 1000 is shown having a substrate 1002 such as a laminated plastic or ceramic substrate.

Mounted above the substrate 1002 is an integrated circuit 1004 such as a wire-bonded die with an active side 1006. The active side 1006 of the integrated circuit is connected to the substrate 1002 with bond wires 1008. The integrated circuit is attached to the substrate 1002 with a die attach adhesive 1010.

Mounted above the integrated circuit 1004 is an inner stacking module such as the integrated circuit packaging system 100 of FIG. 1. The inner stacking module 100 is inverted so that the embedded-solder-balls 104 are facing the active side 1006 of the integrated circuit 1004.

The inner stacking module 100 is connected to the integrated circuit 1004 with internal interconnects such as solder balls 1012. From above, the inner stacking module 100 is connected to the substrate 1002 with the bond wires 1008.

An encapsulation 1014 encapsulates the integrated circuit 1004 and the inner stacking module 100. The inner stacking module 100 has a surface 1016 exposed from the encapsulation 1014, which will facilitate connection with external devices. Mounted below the substrate 1002 are external interconnects 1018 such as solder balls.

Figure 11:
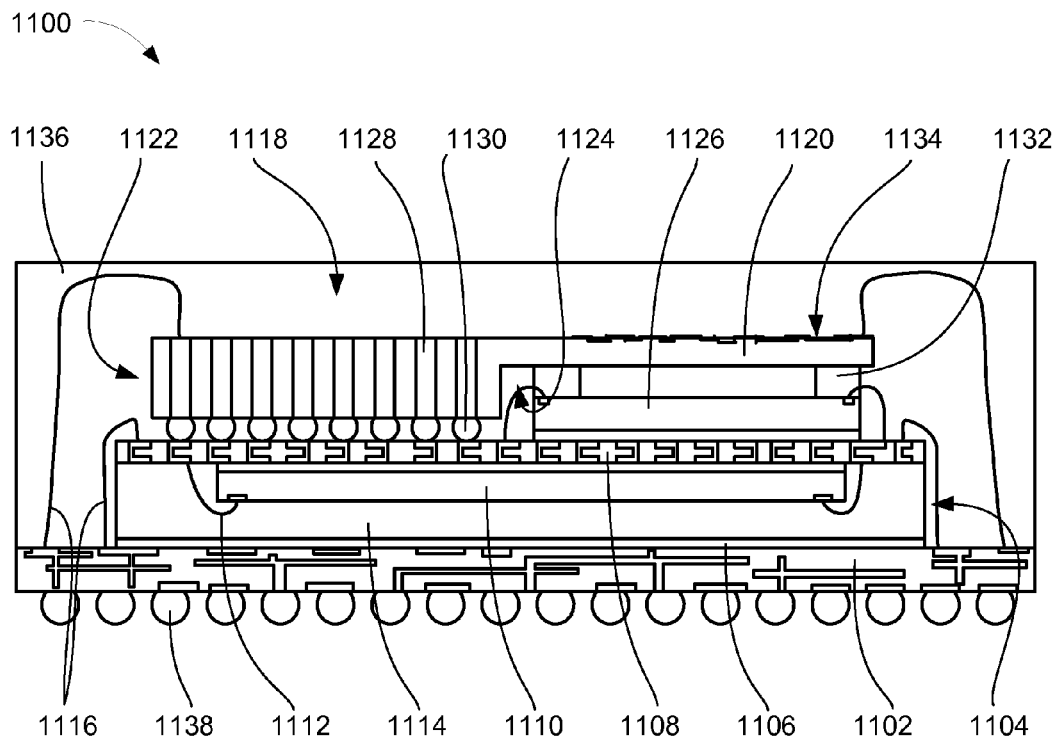
FIG. 11 is a cross-sectional view of an integrated circuit packaging system in an eighth embodiment of the present invention.

Referring now to FIG. 11, therein is shown a cross-sectional view of an integrated circuit packaging system 1100 in an eighth embodiment of the present invention. The integrated circuit packaging system 1100 is shown having a substrate 1102 such as a ceramic or a laminated plastic substrate.

Mounted above the substrate 1102 is an inner stacking module 1104. The inner stacking module 1104 is attached to the substrate 1102 with die attach adhesive 1106.

The inner stacking module 1104 has an ISM substrate 1108. Mounted below the ISM substrate 1108 is an ISM device semiconductor 1110 such as a wire-bonded die connected to the substrate with ISM device bond wires 1112. The ISM device semiconductor 1110 is encapsulated in an ISM encapsulation 1114.

The ISM substrate 1108 faces away from the substrate 1102 and the ISM substrate 1108 is connected to the substrate 1102 from above by interconnects such as bond wires 1116.

Mounted above the ISM substrate 1108 is a structure such as a Through Silicon Via die (TSV die 1118). The TSV die 1118 is shown having a body portion 1120 and a pedestal portion 1122. The pedestal portion 1122 is integral to the body portion 1120 and combine to form a recess 1124.

The body portion 1120 is elevated above a semiconductor device 1126, which is positioned within the recess 1124. The pedestal portion 1122 is sufficiently tall to provide a sufficiently large recess in the body portion 1120 to accommodate the semiconductor device 1126. The recess 1124 helps to reduce the overall size of the package allowing for application in increasingly thin electronic devices.

The pedestal portion 1122 of the TSV die 1118 is shown having Through Silicon Vias 1128. It has been discovered that the Through Silicon Vias 1128 in the pedestal portion 1122 provide an extremely efficient electronic signal path, while the height of the pedestal portion 1122 allows the pedestal portion 1122 to be connected to the ISM substrate 1108 using a very fine pitch. Therefore, internal interconnects 1130 such as solder balls connecting the pedestal portion 1122 to the ISM substrate 1108 may be very high density providing greater I/O capacity.

Further, because the internal interconnects 1130 may be much smaller, the collapse characteristics are unexpectedly improved. Still further, the pedestal portion 1122 reduces the amount of filler needed to manufacture the integrated circuit package therefore reducing production costs.

The semiconductor device 1126 may be connected to the ISM substrate 1108 by the bond wires 1116 and may be attached to the body portion 1120 of the TSV die 1118 with a wire-in-film adhesive 1132. The wire-in-film adhesive 1132 has a low viscosity and, as temperature increases, the viscosity gets lower.

Therefore, the wire-in-film adhesive 1132 can be easily pressed over the bond wires 1116 connecting the semiconductor device 1126 to the ISM substrate 1108, and then cured to harden the wire-in-film adhesive 1132. The semiconductor device 1126 is mounted to the ISM substrate 1108 with the die attach adhesive 1106.

Above the body portion 1120 of the TSV die 1118 a redistribution layer (RDL 1134) may be deposited on the top surface of the TSV die 1118. The RDL 1134 may be used to electrically connect various I/O points on the TSV die 1118 with the Through Silicon Vias 1128 or other I/O points.

An encapsulation 1136 encapsulates the TSV die 1118, the semiconductor device 1126 and the internal interconnects 1130 and the inner stacking module 1104 above the substrate 1102. Below the substrate are external interconnects 1138 such as solder ball external interconnects.

Figure 12:
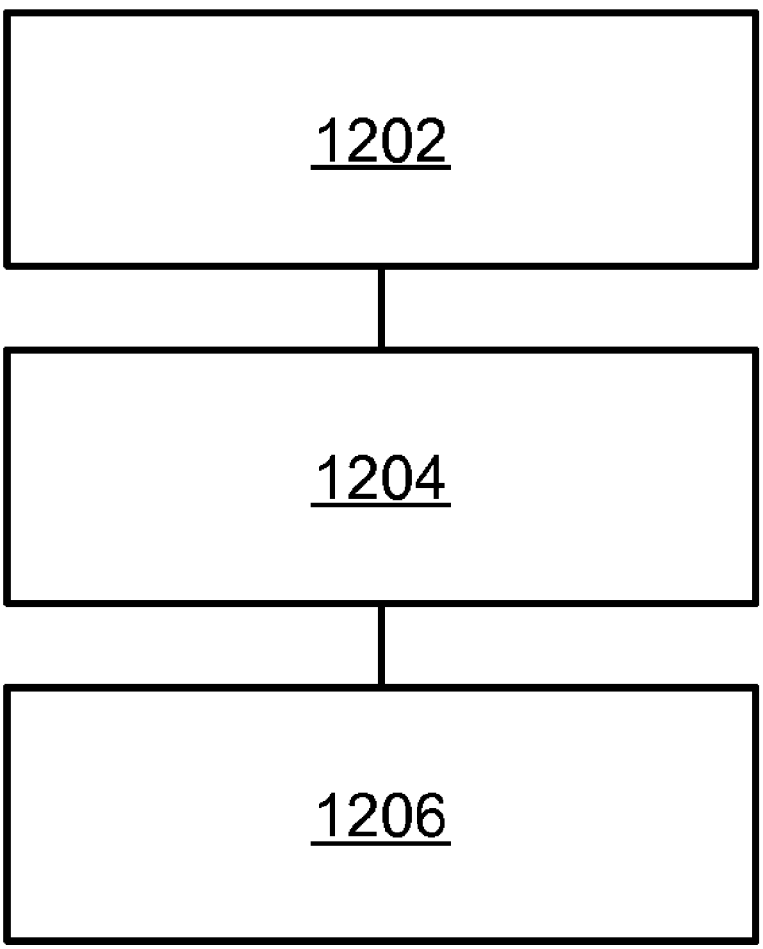
FIG. 12 is a flow chart of a method of manufacture of an integrated circuit packaging system in a further embodiment of the present invention.

Referring now to FIG. 12, therein is shown a flow chart of a method 1200 of manufacture of an integrated circuit packaging system 100 of FIG. 1 in a further embodiment of the present invention. The method 1200 includes providing a structure having a via filled with conductive material completely through the structure, a recess, and a pedestal portion bordering the recess in a block 1202; mounting a semiconductor device inside the recess in the structure in a block 1204; and encapsulating the structure and the semiconductor device in an encapsulation in a block 1206.

It has been discovered that the present invention thus has numerous aspects.

A principle aspect that has been discovered is that the present invention is that the Through Silicon Vias in the pedestal portion provide an extremely efficient electronic signal path, while the height of the pedestal portion allows the pedestal portion to be connected to the substrate using a very fine pitch. Therefore, internal interconnects connecting the pedestal portion to the substrate may be very high density providing greater I/O capacity.

Another aspect is that because the internal interconnects may be much smaller, the collapse characteristics are unexpectedly improved.

Yet another aspect is the pedestal portion reduces the amount of filler needed to manufacture the integrated circuit package therefore reducing production costs.

Yet another aspect is the recess reduces the overall size of the package allowing for application in increasingly thin electronic devices.

Finally, another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the through via die with pedestal of the present invention furnishes important and heretofore unknown and unavailable solutions, capabilities, and functional aspects for integrated circuit packaging system configurations. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
providing a substrate;
mounting a structure on the substrate, the structure having a via filled with conductive material completely through the structure, a recess, and a pedestal portion bordering the recess;
mounting a semiconductor device inside the recess of the structure and between the structure and the substrate; and
encapsulating the structure and the semiconductor device in an encapsulation.

2. The method as claimed in claim 1 further comprising:
forming a redistribution layer on a top surface of the structure.

3. The method as claimed in claim 1 further comprising:
mounting the semiconductor device and the structure to a substrate; and
connecting the semiconductor device and the structure to the substrate with internal interconnects.

4. The method as claimed in claim 1 wherein:
mounting the semiconductor device includes mounting a through via die, a wire-bonded die, a bumped die, a flip-chip, a semiconductor package, or a combination thereof.

5. The method as claimed in claim 1 wherein:
providing the structure having the via filled with conductive material includes providing the structure having the via filled with conductive material through the pedestal portion and not a body portion of the structure.

6. A method of manufacture of an integrated circuit packaging system comprising:
providing a substrate;
providing a wafer;
forming a through hole, a blind hole, or a combination thereof in the wafer;
filling the through hole, the blind hole, or the combination thereof with a conductive filler;
forming a recess and a pedestal portion in the wafer by grinding or etching the structure;
singulating the wafer into a structure;
mounting the structure on the substrate;
mounting a semiconductor device inside the recess of the structure and between the structure and the substrate; and
encapsulating the structure and the semiconductor device in an encapsulation.

7. The method as claimed in claim 6 wherein:
forming the recess and the pedestal portion includes forming a pedestal portion with an L-shaped layout, a U-shaped layout, a plurality layout, or a combination thereof.

8. The method as claimed in claim 6 further comprising:
mounting an external device above the structure.

9. The method as claimed in claim 6 further comprising:
forming embedded-solder-balls embedded in the encapsulation having a surface exposed from the encapsulation.

10. The method as claimed in claim 6 further comprising:
connecting the structure to an inner stacking module with internal interconnects;
connecting the structure and the inner stacking module to a substrate with interconnects; and
wherein:
encapsulating the structure also includes encapsulating the inner stacking module with the encapsulation.

11. An integrated circuit packaging system comprising:
a substrate;
a structure mounted on the substrate, the structure having a via filled with conductive material completely through the structure, a recess, and a pedestal portion bordering the recess;
a semiconductor device mounted inside the recess of the structure and between the structure and the substrate; and
an encapsulation encapsulating the structure and the semiconductor device.

12. The system as claimed in claim 11 further comprising:
a redistribution layer on a top surface of the structure.

13. The system as claimed in claim 11 further comprising:
the semiconductor device is attached to the structure with a wire-in-film adhesive.

14. The system as claimed in claim 11 wherein:
the semiconductor device is a through via die, a wire-bonded die, a bumped die, a flip-chip, a semiconductor package, or a combination thereof.

15. The system as claimed in claim 11 wherein:
the via filled with conductive material is through the pedestal portion and not a body portion of the structure.

16. The system as claimed in claim 11 further comprising:
a substrate mounted to the semiconductor device and the structure; and
internal interconnects which connect the semiconductor device and the structure to the substrate.

17. The system as claimed in claim 16 wherein:
the pedestal portion is an L-shaped layout, a U-shaped layout, a plurality layout, or a combination thereof.

18. The system as claimed in claim 16 further comprising:
an external device mounted above the structure.

19. The system as claimed in claim 16 further comprising:
embedded-solder-balls embedded in the encapsulation having a surface exposed from the encapsulation.

20. The system as claimed in claim 16 further comprising:
an inner stacking module, the inner stacking module connected to the structure and both the inner stacking module and the structure connected to the substrate; and
wherein:
the inner stacking module is encapsulated with the encapsulation.

* * * * *